United States Patent
Hsing

(12) 
(10) Patent No.: US 6,518,138 B2
(45) Date of Patent: Feb. 11, 2003

(54) METHOD OF FORMING SELF-ALIGNED LATERAL DMOS WITH SPACER DRIFT REGION

(75) Inventor: Michael R. Hsing, Saratoga, CA (US)

(73) Assignee: Monolithic Power Systems, Inc., Santa Clara, CA (US)

( * ) Notice: Subject to any disclaimer, the term of this patent is extended or adjusted under 35 U.S.C. 154(b) by 0 days.

(21) Appl. No.: 09/796,384

(22) Filed: Feb. 28, 2001

(65) Prior Publication Data

US 2001/0009790 A1 Jul. 26, 2001

Related U.S. Application Data

(62) Division of application No. 09/080,889, filed on May 18, 1998, now Pat. No. 6,252,278.

(51) Int. Cl.$^7$ ............................................. H01L 21/336
(52) U.S. Cl. ........................ 438/306; 438/301; 438/307; 438/286
(58) Field of Search ................................. 438/301, 306, 438/307, 286; 148/DIG. 96

(56) References Cited

U.S. PATENT DOCUMENTS

| | | | | |
|---|---|---|---|---|
| 5,517,046 A | * | 5/1996 | Hsing et al. | 257/336 |
| 5,846,866 A | * | 12/1998 | Huang et al. | 438/306 |
| 6,258,674 B1 | * | 7/2001 | Kwon et al. | 438/286 |

* cited by examiner

*Primary Examiner*—Long Pham
(74) *Attorney, Agent, or Firm*—Perkins Coie LLP

(57) ABSTRACT

An LDMOS transistor formed in an N-type substrate. A polysilicon gate is formed atop the N-type substrate. A P-type well is formed in the N-type substrate extending from the source side to under the polysilicon gate. A N$^+$ source region is formed in the P-type well and adjacent to the polysilicon gate. A N$^+$ drain region is formed in the N-type substrate and in the drain side of the polysilicon gate. Finally, an N-type drift region is formed between the N$^+$ drain region and the polysilicon gate, wherein the N-type drift region does not extend to said polysilicon gate.

10 Claims, 6 Drawing Sheets

METHOD OF FORMING SELF-ALIGNED LATERAL DMOS WITH SPACER DRIFT REGION

This application is a division of Ser. No. 09/080,889 filed on May 18, 1998 now U.S. Pat. No. 6,252,278.

FIELD OF THE INVENTION

This invention relates to lateral double diffused metal oxide semiconductor (LDMOS) transistors and, in particular, to an improved LDMOS transistor having a drift region separated from the gate by a sidewall spacer.

BACKGROUND OF THE INVENTION

Power semiconductor devices are currently being used in many applications. Such power devices include high voltage integrated circuits which typically include one or more high voltage transistors, often on the same chip as low voltage circuitry. A commonly used high voltage component for these circuits is the lateral double diffused MOS transistor (LDMOS). LDMOS structures used in high voltage integrated circuits may generally be fabricated using some of the same techniques used to fabricate low voltage circuitry. In general, these existing LDMOS structures are fabricated in a thick epitaxial layer of opposite conductivity type to the substrate.

High power applications have called for the use of such LDMOS transistors primarily because they possess lower "on" resistance, faster switching speed, and lower gate drive power dissipation than their bipolar counterparts. One of the major measures of performance for an LDMOS transistor is its on resistance and its breakdown voltage. Clearly, it is preferred to have a low on resistance with a high breakdown voltage. However, since the on resistance is proportional to the epitaxial layer resistivity, higher breakdown voltages must generally be traded off for limited drive current capability. In other words, the breakdown voltage of the LDMOS transistor is optimized by adjusting the drift region, but often at the cost of increased resistivity due to typically lower doped concentrations. One example of such an LDMOS structure is shown in U.S. Pat. No. 5,517,046 to Hsing et al. In the '046 patent, a lateral DMOS transistor is formed in an N-type silicon epitaxial layer. An N-type enhanced drift region is formed between the drain and gate of the transistor in the N-type epitaxial layer. The N-type enhanced drift region serves to significantly reduce on resistance without significantly reducing breakdown voltage.

Specifically, FIG. 1 illustrates the prior art LDMOS transistor of the '046 patent. A starting substrate of P-type silicon 20 is provided. An epitaxial layer of N-type 22 is grown on the surface of the substrate using conventional techniques. Optionally, an N+ buried layer 23 may be formed at the interface of the N− epitaxial layer 22 on the substrate. This is provided to reduce the beta of any parasitic PNP bipolar transistor formed. Next, a thin gate oxide layer 24 is formed atop the epitaxial layer 22. A polysilicon layer is then deposited atop the gate oxide 24 and patterned and etched to form a polysilicon gate 26. Boron ions are then implanted to form a P− type body 29. Further, a P+ body contact 28 is then formed in the body 29 using ion implantation.

An N enhanced drift region 31 is then formed using ion implantation. The drift region 31 is self-aligned with the gate 26. A second implantation process is then used to form N+ source region 32 and N+ drain region 34. Finally, metal source contact 37 and drain contact 38 are then formed by conventional techniques. The breakdown voltage of the transistor is dependent upon the spacing between the drain 34 and the gate 26 and the total charge in the drift region. Although effective, what is still needed is a LDMOS transistor that exhibits even higher breakdown voltage while maintaining low on resistance.

SUMMARY OF THE INVENTION

An LDMOS transistor formed in an N-type substrate is disclosed. The LDMOS transistor comprises: a polysilicon gate atop said N-type substrate, said polysilicon gate comprising a thin gate oxide layer and a polysilicon layer, said polysilicon gate having a source side and a drain side; a P-type well formed in said N-type substrate extending from said source side to under said polysilicon gate; a N+ source region formed in said P-type well and adjacent to said polysilicon gate; a N+ drain region formed in said N-type substrate and in said drain side of said polysilicon gate; and an N-type drift region between said N+ drain region and said polysilicon gate, wherein said N-type drift region not extending to said polysilicon gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

This prior art structure of the '046 patent has been modified in the present invention to include an asymmetrical sidewall spacer on the drain side of the gate. As a result of the spacer, there is separation between the gate and the drift region. Therefore, the electrical field is reduced and the breakdown voltage of the LDMOS transistor is increased. Further, it has been found that the spacer also reduces the current density in the drain region of the LDMOS. Therefore, the LDMOS transistor has a greater safe operating region during high current operations. Specifically, turning to FIG. 2, in many respects, the present invention is substantially similar to that of the '046 patent. Note, however, that a sidewall spacer 59 is included between the drift region 51 and the polysilicon gate 46.

Figure 1:
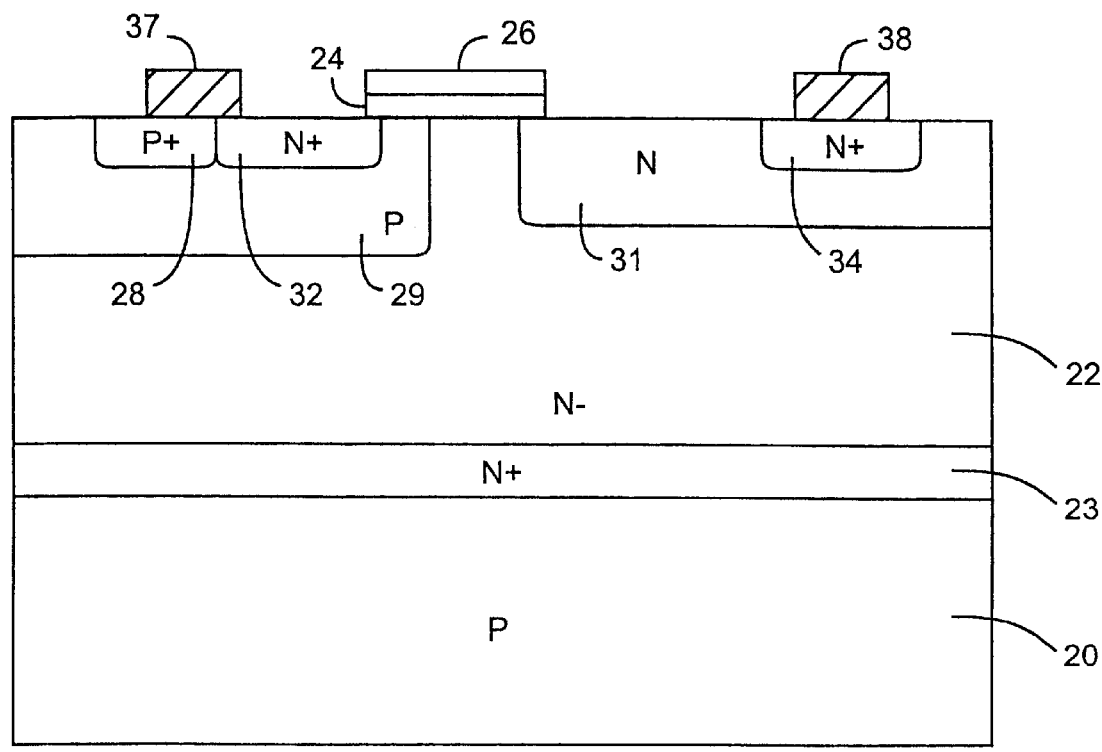
FIG. 1 is a cross section view of a prior art lateral DMOS transistor.

Returning to FIG. 1, for a transistor operating at a voltage of between 15 to 25 volts, the enhanced drift region 31 should not be fully depleted. Therefore, the resistance in the N enhanced drift region 31 consists of the depleted portion and nondepleted portion. Since the depleted region is small in comparison with the nondepleted region, the resistance due to the nondepleted region is dominant. There are two methods to reduce the resistance in the nondepleted region: (1) increase the drift region doping; (2) reduce the drift region space. Increasing the doping lowers the breakdown voltage since the depletion region also becomes smaller.

Reduction of the drift region space creates process control difficulties in precisely controlling the extent of the drift region. The present invention teaches the use of a sidewall spacer to precisely control the dimension of the drift region.

Figure 3:
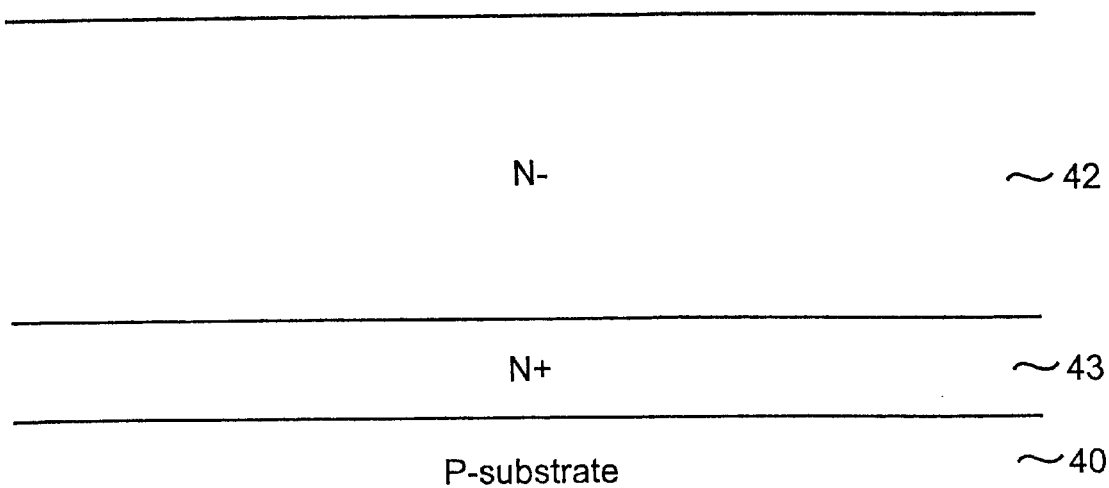
FIGS. 3–8 are cross-sectional views of a semiconductor substrate illustrating the process of manufacturing the LDMOS transistor of FIG. 2.

The manufacture of an LDMOS transistor in accordance with the present invention is now described. Turning to FIG. 3, a P-type substrate 40 is provided upon which is formed an N+ buried layer 43. Formed atop the N+ buried layer 23 is an N− epitaxial layer 42. The N+ buried layer 23 is functional to reduce the beta of any parasitic PNP bipolar transistor formed. The N− layer 42 is preferably on the order of 2 microns thick. It is preferred that the resistivity of N− layer 42 is 0.4 ohm-cm. The P-type substrate 40 has a preferred resistivity of 6–50 ohm-cm. It should be noted that the N+ buried layer 43 is optional and may be omitted. Further, in alternative embodiments, the substrate 40 may be an N− type silicon substrate. In this alternative embodiment, the epitaxial layer of N− layer 42 may be eliminated and the LDMOS transistors may be built directly into the substrate. Further, the N− epitaxial layer 42 may be replaced by an N-well formed in the P-type substrate 40. Finally, in all embodiments described herein, the conductivity types may be reversed.

Figure 4:
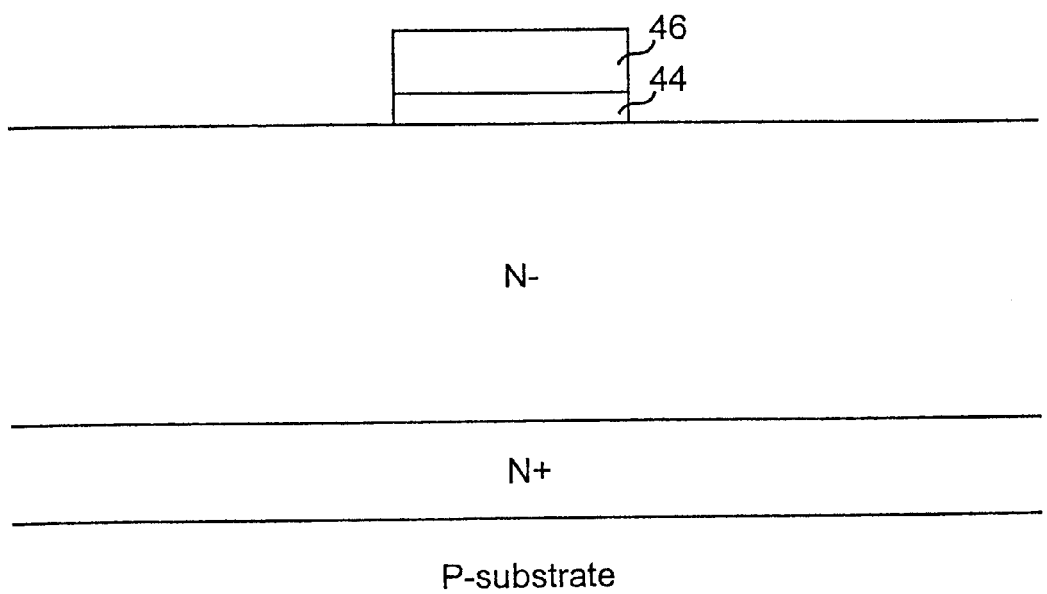

Next, turning to FIG. 4, a polysilicon gate 46 is formed atop a gate oxide 44. The formation of this structure is formed using conventional means. For example, a thin (approximately 200 Angstrom) layer of gate oxide 24 is grown on the surface of the N− epitaxial layer 42. Then, a layer of polysilicon is deposited on the surface of the gate oxide 44 to a thickness of approximately 4000 Angstrom and then defined using conventional photolithography and etching techniques to produce the polysilicon gate 46. The polysilicon may be in situ-doped or doped in a later doping step to be made conductive. In the preferred embodiment, the polysilicon is doped heavily N-type.

Figure 5:
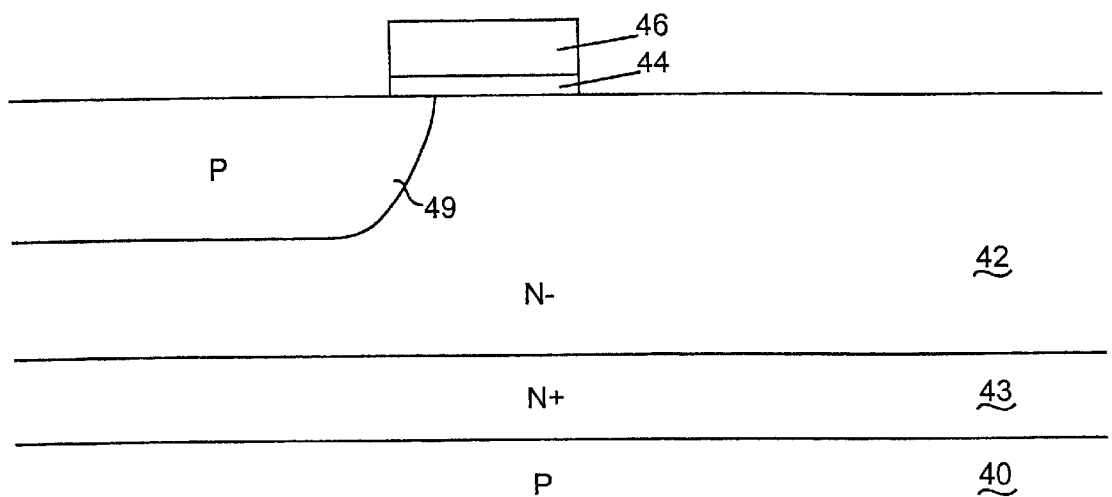

Using a masking process, boron ions are implanted to form a P− type body 49. Drive in of these ions may be performed next or in conjunction with later heating steps. In one embodiment, P-type body 49 has an impurity doping concentration on the order of $4e17$ ions/cm$^3$. However, concentration may vary considerably depending upon the desired transistor characteristics. The resulting structure is shown in FIG. 5.

Figure 6:
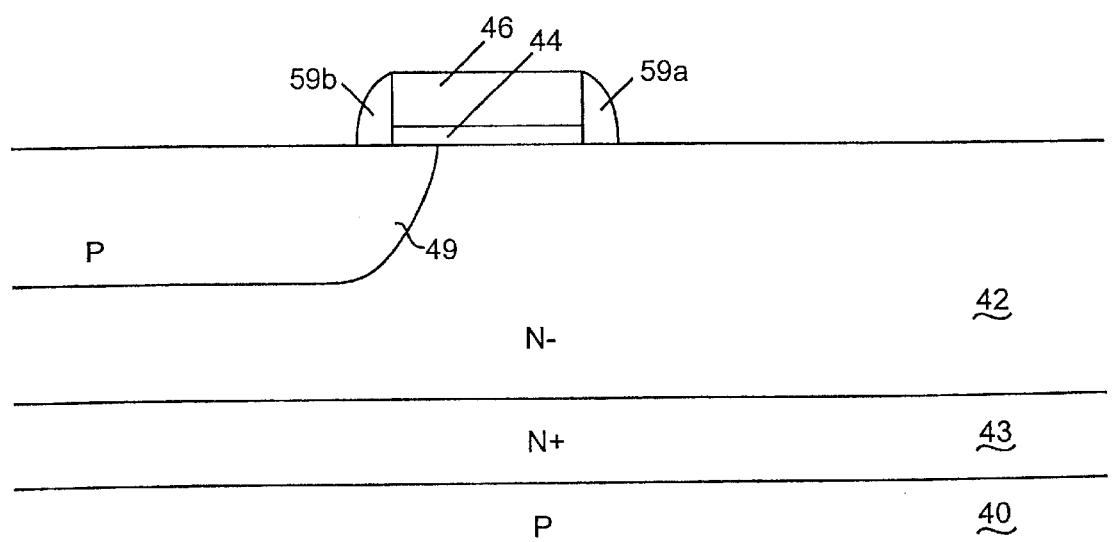

Turning to FIG. 6, sidewall spacers 59a and 59b are then formed on the sidewalls of the polysilicon gate 46. The sidewall spacers 59a and 59b are formed using conventional CMOS processes comprising the steps of chemical vapor deposition of a material followed by a reactive ion etching step. The sidewall spacers 59a and 59b may be formed from any suitable material such as silicon oxide, silicon nitride, or polysilicon. It can be appreciated by those skilled in the art that if polysilicon is used as the sidewall spacer material, then a liner oxide layer must first be formed over the gate 46 and N− epitaxial layer 42 for insulation purposes. Polysilicon, although requiring this additional step, is generally easier to etch than nitride or oxide. In the preferred embodiment, the sidewall spacers are approximately 2000 angstroms wide.

Figure 7:
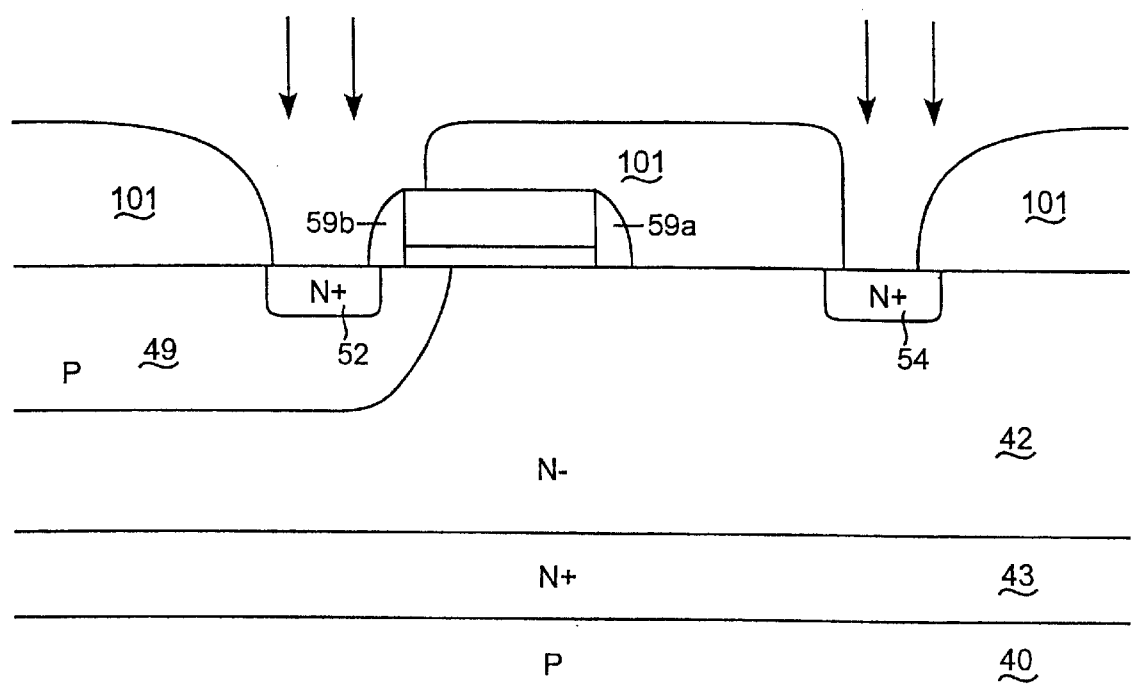

After the sidewall spacers have been formed, a photoresist mask 101 is deposited and developed as shown in FIG. 7. The photoresist mask 101 includes openings for the formation of the source 52 and drain 54. Next, ion implantation of arsenic ions is performed with an implant dosage of $4$–$7e15$ ions/cm$^2$. After drive-in through later heating cycles, the source 52 and drain 54 are as illustrated in FIG. 7.

Figure 8:
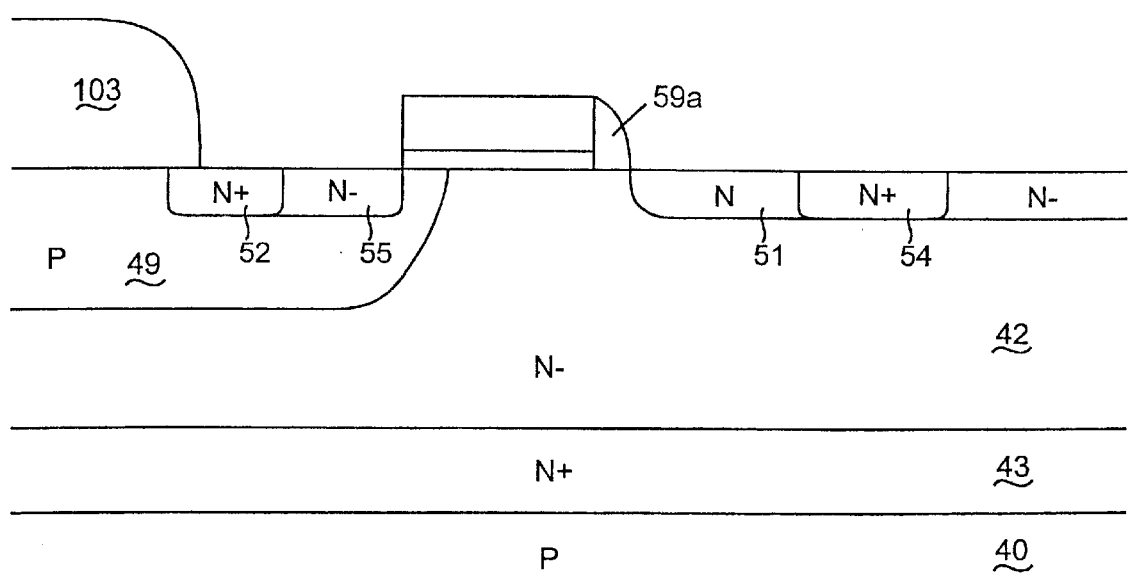

Next, turning to FIG. 8, the source side sidewall spacer 59b is removed using conventional techniques. For example, a further etching may be performed using the photoresist layer 101 as a mask. The photoresist mask 101 is then stripped and a second photoresist mask 103 is deposited and developed as shown in FIG. 8.

Next, a self-aligned ion implantation is performed to form the lightly doped N− drift region 51. The lightly doped N− drift region 51 extends from the drain 54 to the edge of the sidewall spacer 59b. Additionally, a lightly doped region 55 is formed between the source 52 and the polysilicon gate 46. The implantation to form regions 51 and 55 may be performed using either phosphorous or arsenic ions at a dosage of $6e13$ to $1e14$ ions/cm$^2$. After the implantation, the second photoresist mask 103 is removed.

Figure 2:
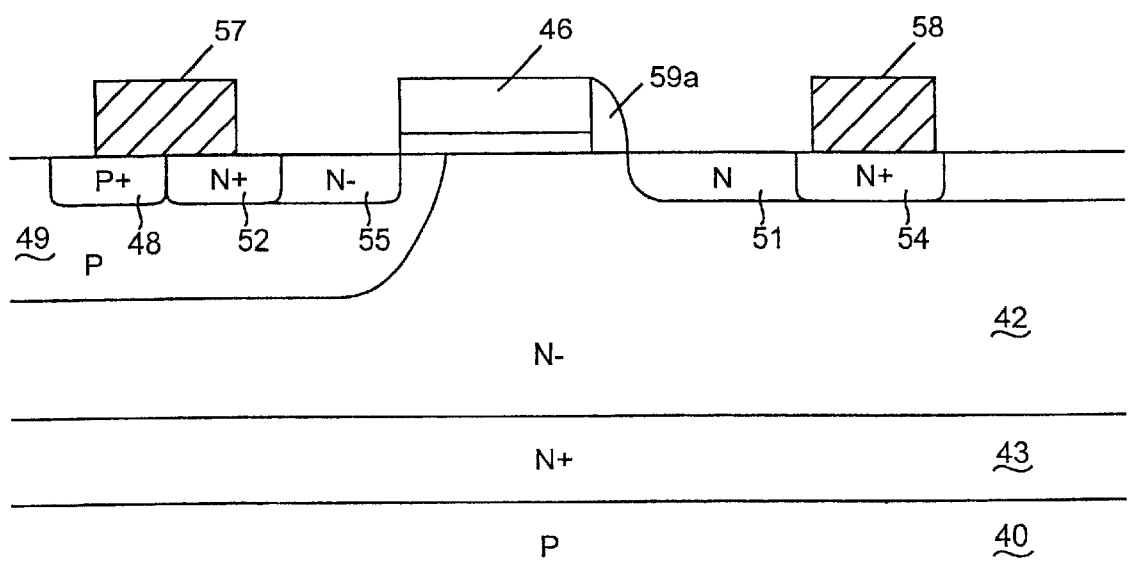
FIG. 2 is a cross section view of an LDMOS transistor formed in accordance with the present invention.

Next, a P+ body contact 48 is then formed in the body 49 using conventional masking and ion implantation. Metal contacts to the source 52 and drain 54 regions are then formed to complete the transistor. The resulting structure is shown in FIG. 2.

Prior to the formation of the metal contacts, to optionally reduce the resistivity at the surface of the source 52 and drain 54, a layer of oxide may be deposited over the surface of the wafer and then etched back to expose the surface of the source 32 and drain 34. A salicide is then formed on the exposed surfaces of these silicon regions (source 52 and drain 54) by sputtering or evaporating a thin layer of a refractory metal and then heating the wafer to react the metal with the silicon to form a salicide.

Figure 9:
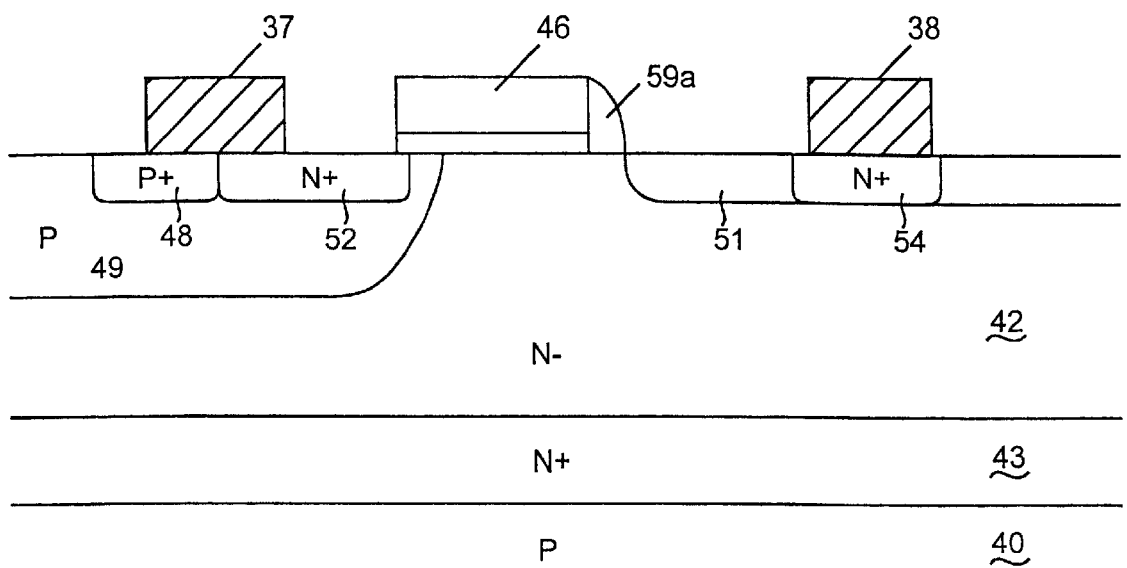
FIG. 9 is a cross section view of an LDMOS transistor formed in accordance with an alternative embodiment of the present invention.

In an alternative embodiment shown in FIG. 9, the sidewall spacer 59b is removed prior to the formation of the source region 52. This results in a source region 52 that extends at least to the edge of the polysilicon gate 46.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for making a LDMOS transistor in an N-type substrate, the method comprising the steps of:

forming a polysilicon gate atop said N-type substrate, said polysilicon gate comprising a thin gate oxide layer and a polysilicon layer, said polysilicon gate having a source side and a drain side;

forming a P-type well in said N-type substrate extending from said source side to under said polysilicon gate;

forming a drain side sidewall spacer on the drain side sidewall of said polysilicon gate;

forming in said P-type well a source region adjacent to said polysilicon gate;

forming a drain region on said drain side of said polysilicon gate; and subsequent to forming said drain side sidewall spacer, forming a N-type drift region between said drain region and said drain side sidewall spacer.

2. The method of claim 1 wherein said N-type substrate sits atop a N+ guard band and a P-type substrate.

3. The method of claim 1 further including the step of forming metal contacts to said source region and said drain region.

4. A method for making a LDMOS transistor in an N-type substrate, the method comprising:

forming a polysilicon gate atop said N-type substrate, said polysilicon gate comprising a thin gate oxide layer and a polysilicon layer, said polysilicon gate having a source side and a drain side;

forming a P-type well in said N-type substrate extending from said source side to under said polysilicon gate;

forming a drain side sidewall spacer on the drain side sidewall of said polysilicon gate;

forming in said P-type well a source region adjacent to said polysilicon gate;

forming a drain region on said drain side of said polysilicon gate;

forming a N-type drift region between said drain region and said drain side sidewall spacer;

forming and using a source side sidewall spacer to form said source region such that said source region is adjacent said source side sidewall spacer;

removing said source side sidewall spacer; and forming a lightly doped region between said source region and said polysilicon gate.

5. The method of claim 1 wherein said drain side sidewall spacer is formed from polysilicon.

6. A method for making a LDMOS transistor in an P-type substrate, the method comprising the steps of:

forming a polysilicon gate atop said P-type substrate, said polysilicon gate comprising a thin gate oxide layer and a polysilicon layer, said polysilicon gate having a source side and a drain side;

forming a N-type well in said P-type substrate extending from said source side to under said polysilicon gate;

forming a drain side sidewall spacer on the drain side sidewall of said polysilicon gate;

subsequent to forming said drain side sidewall spacer, forming in said N-type well a source region adjacent to said polysilicon gate;

forming a drain region on said drain side of said polysilicon gate; and forming a P-type drift region between said drain region and said drain side sidewall spacer.

7. The method of claim 6 wherein said P-type substrate sits atop a $P^+$ guard band and a N-type substrate.

8. The method of claim 6 further including the step of forming metal contacts to said source region and said drain region.

9. A method for making a LDMOS transistor in an P-type substrate, the method comprising the steps of:

forming a polysilicon gate atop said P-type substrate, said polysilicon gate comprising a thin gate oxide layer and a polysilicon layer, said polysilicon gate having a source side and a drain side;

forming a N-type well in said P-type substrate extending from said source side to under said polysilicon gate;

forming a drain side sidewall spacer on the drain side sidewall of said polysilicon gate;

forming in said N-type well a source region adjacent to said polysilicon gate;

forming a drain region on said drain side of said polysilicon gate; and forming a P-type drift region between said drain region and said drain side sidewall spacer;

forming and using a source side sidewall spacer to form said source region such that said source region is adjacent said source side sidewall spacer;

removing said source side sidewall spacer; and forming a lightly doped region between said source region and said polysilicon gate.

10. The method of claim 6 wherein said drain side sidewall spacer is formed from polysilicon.

* * * * *